(12) United States Patent
Weir

(10) Patent No.: US 7,898,277 B2
(45) Date of Patent: Mar. 1, 2011

(54) HOT-ELECTRONIC INJECTION TESTING OF TRANSISTORS ON A WAFER

(75) Inventor: Bonnie Weir, Bronxville, NY (US)

(73) Assignee: Agere Systems Inc., Allentown, PA (US)

( * ) Notice: Subject to any disclaimer, the term of this patent is extended or adjusted under 35 U.S.C. 154(b) by 167 days.

(21) Appl. No.: 12/344,016

(22) Filed: Dec. 24, 2008

(65) Prior Publication Data

US 2010/0156454 A1    Jun. 24, 2010

(51) Int. Cl.
*G01R 31/26* (2006.01)

(52) U.S. Cl. .................................. 324/762.01

(58) Field of Classification Search .............. 324/760, 324/765–769
See application file for complete search history.

(56) References Cited

U.S. PATENT DOCUMENTS

| | | | | |
|---|---|---|---|---|
| 5,600,578 | A * | 2/1997 | Fang et al. ................. | 703/14 |
| 5,999,011 | A * | 12/1999 | Chu et al. .................. | 324/769 |
| 7,106,088 | B2 * | 9/2006 | Tsai et al. .................. | 324/769 |
| 7,750,400 | B2 * | 7/2010 | Shanware et al. ........... | 257/335 |

OTHER PUBLICATIONS

Keithley Instruments Inc., Evaulating Hot Carrier Induced Degradation of MOSFET Devices. 2000. No. 2197.*
Aur, Shian; Low Voltage Hot Carrier Effects and Stress Methodology—VLSI Technology, Systems, and Applications, 1995. Proceedings of Technical Papers; pp. 277-280.
Yung et al.; Implementation of Fast Wafer level Reliability Monitoring Strategy for Wafer Fab Process Monitoring; The 5th Student Conference on Research and Development- SCOReD 2007, Dec. 11-12, 2007, Malaysia.
JEDEC Standard, JESD60A, Sep. 2004, JEDEC Solid State Technology Association.
Zhao et al.; Hot Electron Induced Punchthrough (HEIP) in p-Channel SOI MOSFET's—SOI Conference, 1998. Proceedings., 1998 IEEE International; pp. 83-84.
JEDEC Standard, JESD28-A, Dec. 2001, JEDEC Solid State Technology Association.
Koike et al.; A hot carrier parallel testing technique to give a reliable extrapolation—Microelectronic Test Structures, 1991. ICMTS 1991., Proceedings of the 1991 International Conference; pp. 237-240.
Chen et al.; Direct evidence for multiple vibrational excitation of Si-H/D bonds for hot-carrier degradation of M—Device Research Conference, 2002. 60th DRC. Conference Digest; pp. 189-190.

* cited by examiner

*Primary Examiner*—Ha Tran T Nguyen
*Assistant Examiner*—Joshua Benitez

(57) ABSTRACT

A hot-carrier injection (HCI) test that permits rapid screening of integrated circuit wafers susceptible to possible HCI-induced failures is disclosed. A method is described that determines transistor stress voltages that results in a transistor HCI-induced post-stress drain current differing from a pre-stress drain current within a desired range. These stress voltages are determined using a wafer with acceptable HCI susceptibility. Additional wafers to be tested are first tested using a described method that uses the determined transistor stress voltages to quickly screen the wafers for HCI susceptibility and, if HCI susceptibility is found, then additional conventional HCI testing may be applied to the susceptible wafers.

19 Claims, 3 Drawing Sheets

300

HOT-ELECTRONIC INJECTION TESTING OF TRANSISTORS ON A WAFER

TECHNICAL FIELD

The present invention relates to integrated circuit testing, and, in particular, to hot-carrier injection testing of transistors in integrated circuit wafers or the like.

BACKGROUND

As integrated circuit device features continue to shrink beyond 90 nm, the electrical characteristics of transistors with 90 nm and smaller gate lengths have become less than ideal. For example, leakage current and susceptibility to damage of transistor gate dielectric increases as the transistors get smaller. Further, merely using the integrated circuit results in the threshold voltage of the transistors (the voltage applied to the gate of a transistor at which the transistor begins to conduct) in the integrated circuit shifting (aging) that becomes more pronounced with smaller device dimensions. Unfortunately, the shift in threshold voltage is a significant factor in limiting the useful lifetime of an integrated circuit because the threshold voltage shift by the transistors eventually lead to the transistors possibly becoming unresponsive to signals applied to the gates thereof, leading to the functional failure of the integrated circuit.

One significant contributor to transistor threshold voltage shift is damage to the transistor due to current injection. This phenomenon is known as hot-electron injection or hot-hole injection depending if the affected transistor is an n-channel or p-channel transistor, respectively, and is referred to generically as hot-carrier injection (HCI).

HCI is a slow process during normal operation but the effect thereof is cumulative over the lifetime of the integrated circuit. Therefore, testing production integrated circuits while still in wafer form requires a technique to accelerate the effects of HCI over a relatively short time period, measuring transistor performance during the testing period, and then extrapolating from changes in the transistor performance to get a projection of the device lifetime. If the projected lifetime is less than a particular value, e.g., 15 years, the wafer is rejected for being overly susceptible to HCI. Various HCI testing techniques have been proposed and adopted, such as that described in "Procedure for Measuring N-Channel MOSFET Hot-Carrier-Induced Degradation Under DC Stress," JESD28A, published December 2001 (along with corresponding JESD60A for p-channel transistors, published September 2004) by JEDEC Solid State Technology Association, Arlington, Va., USA, both of which are incorporated by reference herein in their entirety. However, the JEDEC test requires multiple hours to perform, an impractical test technique for testing each wafer on a production line. Instead, statistical sampling of selected wafers is used to project device lifetimes of entire production runs (production lots). This may lead to overly optimistic lifetime estimations (with resulting high field failures) or rejecting many wafers that are otherwise satisfactory absent additional, time consuming testing, both of which are costly.

SUMMARY

In one embodiment, the present invention is a method of hot-carrier injection screening a wafer, the method comprising: providing a wafer having at least one MOSFET thereon, the MOSFET having at least a gate, a drain, and a threshold voltage; applying a gate test voltage to the gate and a drain test voltage to the drain of the MOSFET and measuring an initial current flow in the drain; applying, during a stress time period, a gate stress voltage to the gate and a drain stress voltage to the drain of the MOSFET; and applying, at a time subsequent to the stress time period, the gate test voltage to the gate and the drain test voltage to the drain of the MOSFET and measuring a test current flow in the drain. If the test current flow differs from the initial current flow by less than a first selected amount, the wafer passes the hot-carrier injection screen, and the drain test voltage is less than the threshold voltage.

In another embodiment, the present invention comprises the steps of: selecting one wafer from the plurality of wafers, each wafer having a plurality of MOSFETs thereon and each of the MOSFETs having at least a gate, a drain, and a threshold voltage; selecting one of the plurality of MOSFETs on the selected wafer; applying a gate test voltage to the gate of the selected MOSFET and a drain test voltage to the drain of the selected MOSFET and measuring an initial current flow in the drain of the selected MOSFET; applying, during a stress time period, a gate stress voltage to the gate of the selected MOSFET and a drain stress voltage to the drain of the selected MOSFET; applying, at a time subsequent to the stress time period, the gate test voltage to the gate and the drain test voltage to the drain of the selected MOSFET and measuring a test current flow in the drain of the selected MOSFET; adjusting at least one of the gate and drain stress voltages if the test current flow differs from the initial current flow by less than a selected minimum amount or more than a selected maximum amount. The step of applying, during a stress time period, a gate stress voltage, the step of applying, during a stress time period, a gate stress voltage, and the step of adjusting at least one of the gate and drain stress voltages are repeated with another MOSFET selected from the plurality of MOSFETs until the test current flow differs from the initial current flow greater than the selected minimum amount and less than the selected maximum amount. Preferably, the selected wafer has MOSFETs with acceptable HCI susceptibility. Then at least one of the remaining wafers is hot-carrier injection screened using the stress voltages determined above.

BRIEF DESCRIPTION OF THE DRAWINGS

The aspects, features, and advantages of the present invention will become more fully apparent from the following detailed description, the appended claims, and the accompanying drawings in which like reference numerals identify similar or identical elements.

DETAILED DESCRIPTION

As is well understood in the art, wafers, such as silicon wafers with diameters of 150 mm or more, have formed therein many integrated circuits laid out across the wafer.

Once the wafer is completely fabricated and before the integrated circuits therein are separated from each other ("singulated"), the wafer is subject to extensive testing to determine the functionality of each of the integrated circuits. Prior to the functionality testing, parametric testing of the wafer generally occurs to determine if the processing steps used to form the integrated circuits occurred correctly and within desired tolerances. When a new process is qualified, in addition to conventional parametric tests, the conventional HCI test as described above is done.

Figure 1:
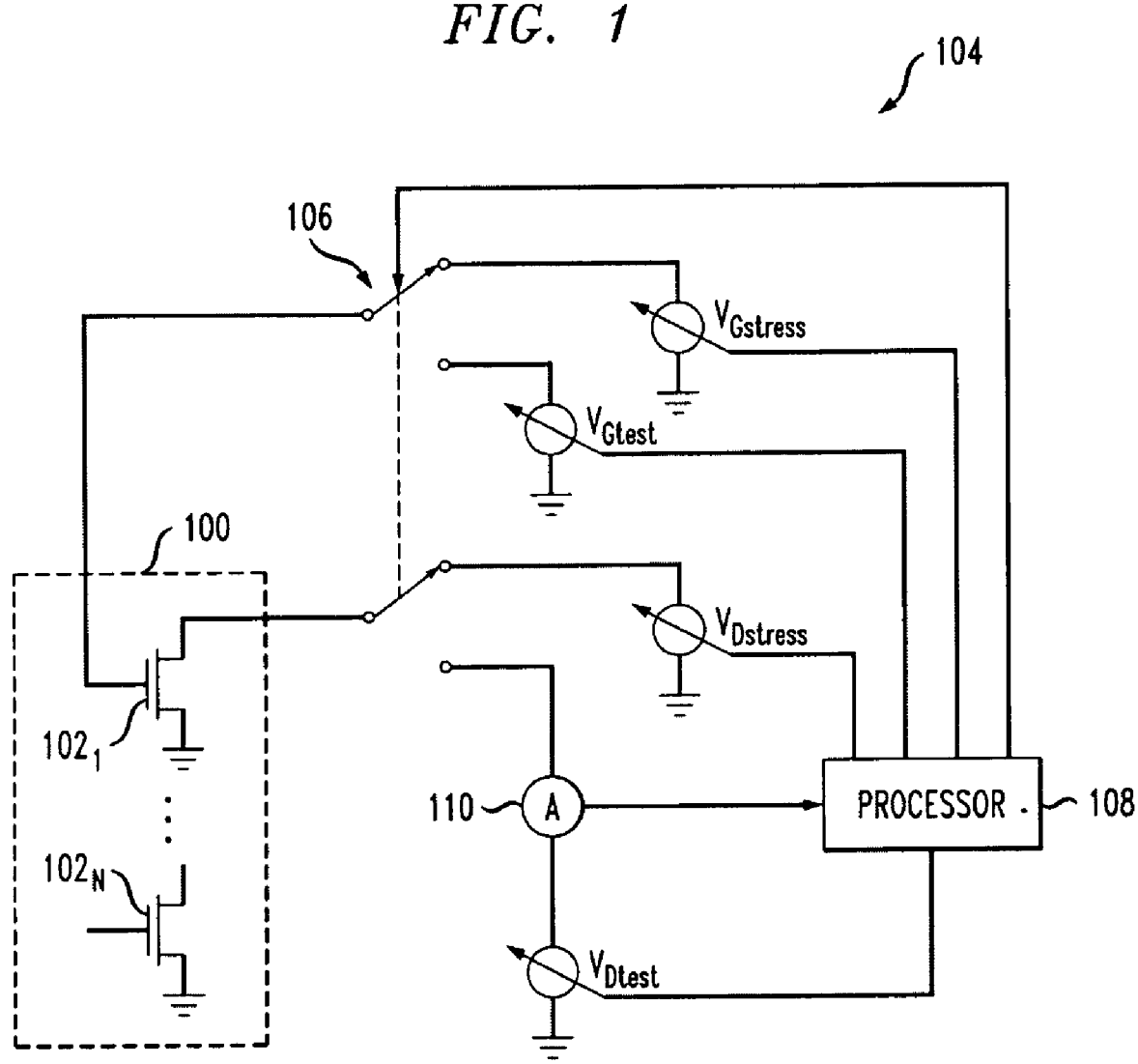
FIG. 1 is a simplified diagram of an exemplary testing apparatus for performing hot-carrier injection (HCI) screening of transistors on a wafer according to one embodiment of the invention.

To perform the HCI test, the wafer is placed in a probing station within a conventional testing apparatus (herein a "test set"). The test set, under control of processor, performs the various tests in sequence. A simplified schematic diagram of a conventional test set configured to perform testing of a wafer for hot-carrier injection (HCI) defects is shown in FIG. 1, in accordance with an exemplary embodiment of the invention. Here, an exemplary wafer 100 has a plurality of transistors $102_1$-$102_N$, each capable of being probed from an exemplary external test set 104 (greatly simplified in this example). As is well understood in the art, test set 104 has probes (not shown) that are capable of contacting (probing) individual transistors on the wafer 100 for testing. The test set 104 has the equivalent of a double-pole, double-throw switch 106 under control of processor 108. The switch 106 couples either conventional variable voltage sources $V_{Gstress}$, $V_{Dstress}$ or conventional variable voltage sources $V_{Gtest}$, $V_{Dtest}$ (in series with ammeter 110) to the gate and drain, respectively, to a selected one of the transistors $102_1$-$102_N$ being tested, herein referred to as a transistor under test (TUT). For purposes here, transistor $102_1$ is the TUT since it is shown being probed by tester 104; it is understood that any one of the transistors $102_1$-$102_N$ may be the TUT. Along with the switch 106, the four conventional variable voltage sources are also under the control of the processor 108. Ammeter 110, readable by the processor 108, measures the drain current of the TUT when coupled by switch 106 to the TUT. It is understood that the voltage sources $V_{Gstress}$ and $V_{Dstress}$ may be combined. Further, switch 106 may be removed and two variable voltage sources, one coupled to the gate and one coupled to the drain of the TUT, may be used to supply both the stress and test voltages to the TUT. For purposes here, reference herein to a voltage source and the voltage it produces are used interchangeably, e.g., $V_{Dstress}$ refers to both the variable voltage source $V_{Dstress}$ and the voltage supplied thereby.

As will be explained in more detail below in connection with FIG. 2, the switch 106 may be configured to apply variable voltage sources $V_{Gstress}$ and $V_{Dstress}$ to "stress" the TUT (e.g., transistor $102_1$) with excessive gate and drain voltages, and is configured to apply variable voltage sources $V_{Gtest}$, $V_{Dtest}$ to test the TUT using voltages equal to or less than voltages which the transistors in the integrated circuit 100 are designed to be operated (hereinafter referred to as Vdd). Generally, Vdd is dependent on the process technology used to fabricate the wafer 100; for example, Vdd may be 1.8 volts for a 90 nm process technology, 1.2 volts for 65 nm process technology, etc. For HCI testing, the voltages from variable voltage sources $V_{Gstress}$ and $V_{Dstress}$ are generally significantly greater than Vdd and are applied to the TUT for an amount of time to result in a change in the DC operating characteristics of the TUT, as described in the above-referenced JEDEC test standard. Typically, the amount of time for the initial stress the TUT is about 10 seconds. Subsequent stress times (if subsequent TUT stress needed) typically increase geometrically. The voltages of the variable voltage sources $V_{Gtest}$, $V_{Dtest}$, $V_{Gstress}$, and $V_{Dstress}$ may be determined as described below in connection with FIG. 3.

Figure 2:
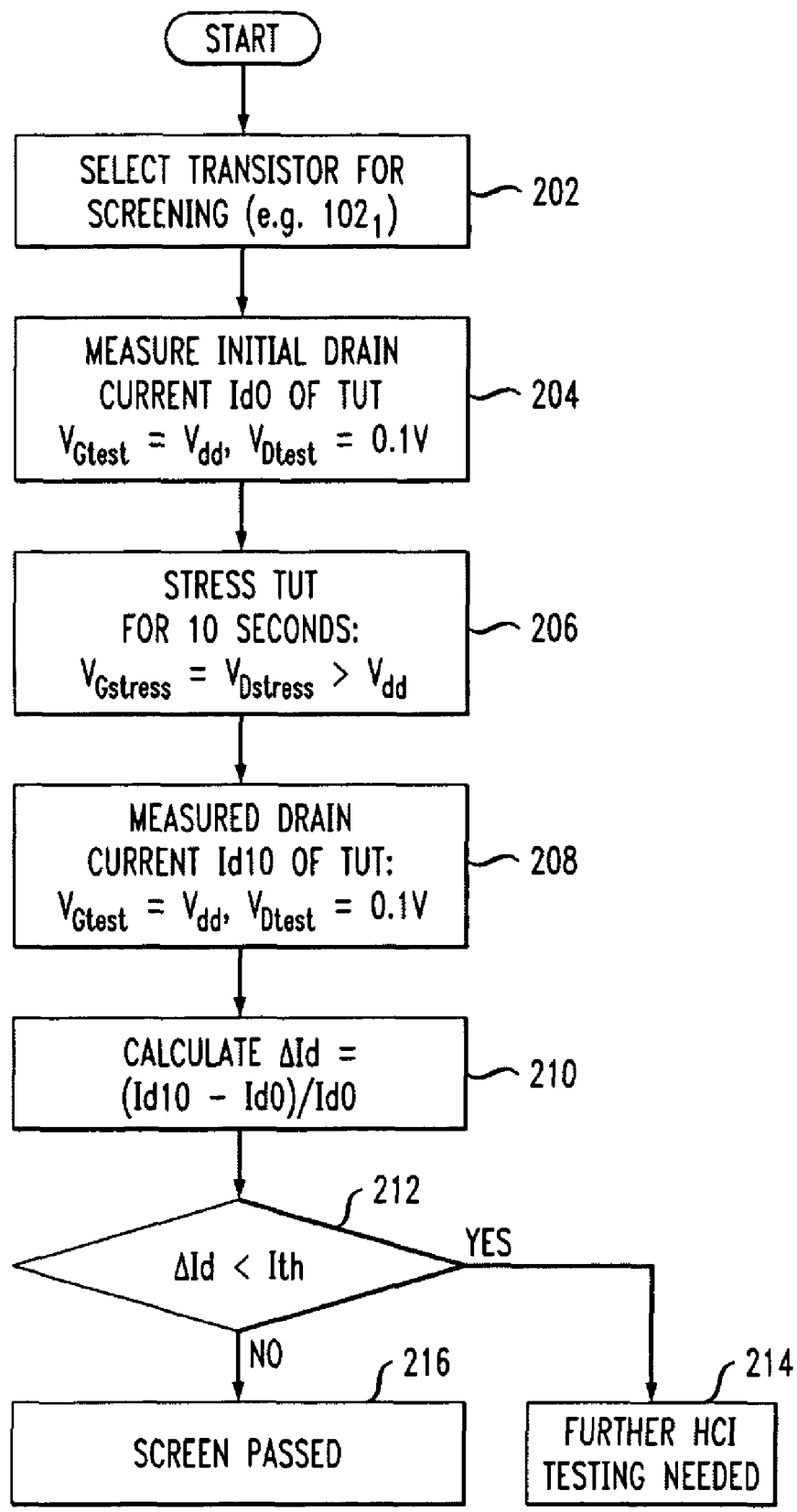
FIG. 2 is a simplified flowchart illustrating an exemplary HCI screening test utilizing the test apparatus of FIG. 1, according to another embodiment of the invention.

Referring to FIG. 2, an exemplary HCI screening test 200 utilizing the test set configuration of FIG. 1, according to another embodiment of the invention, is illustrated. By the judicious choice of stress and test voltages, a simple, fast HCI screening test can be done on an integrated circuit wafer to determine if the transistors thereon are not too susceptible to HCI without the need for a conventional, time consuming, HCI test. If, however, the screening indicates that the integrated circuit wafer might be susceptible to HCI, the wafer may then be subjected to the more definitive and conventional HCI testing, such as the JEDEC technique referred to above.

Beginning with step 202, one of the transistors $102_1$-$102_N$ (FIG. 1) is chosen to be the TUT (in this example, transistor $102_1$ is the TUT) and is probed by the test set 104. It is understood that this TUT has not been previously stressed. In step 204, the nominal drain current (Id0) of the TUT is measured by ammeter 108 for a gate voltage ($V_{Gtest}$) of Vdd (the nominal operating or design voltage of the transistors $102_1$-$102_N$) and a drain voltage ($V_{Dtest}$) of, in this example, approximately 0.1 volts. The drain voltage $V_{Dtest}$ is preferably less than a nominal threshold voltage of the transistors $102_1$-$102_N$. It has been discovered that performing the HCI drain current test step 204 using a very low drain voltages has the advantage of enhancing the effects of stress on the TUT and a drain voltage of approximately 0.1 volts has been found to be low enough for 45 nm gate length transistors to give good results without the drain current having so much noise that the test becomes unreliable. It is understood that the drain voltage may be less than 0.1 volts as device geometries get smaller, or greater than 0.1 volts as may be required.

Next, in step 206, the TUT is stressed for a nominal 10 seconds by applying approximately equal gate and drain voltages that exceed Vdd. Generally, the TUT is most stressed when the gate voltage ($V_{Gstress}$) and drain voltage ($V_{Dstress}$) is the same and significantly exceed Vdd, but it is understood that the gate and drain voltages may be different. As will be discussed in more detail below in connection with FIG. 3, the desired $V_{Gstress}$ and $V_{Dstress}$ voltages may be determined to achieve a desired amount of stress effect in the TUT, the TUT not being significantly susceptible to HCI. Here, $V_{Gstress}$ and $V_{Dstress}$ are greater than Vdd and, and in this example, about 1.5 Vdd. Other time periods may be used instead of 10 seconds but this time interval makes it possible to use this technique in an HCI screening application on many transistors without a prohibitively long test time while being sufficiently long to result in measurable shifts in the electrical characteristics of the TUT with the voltages given above.

In step 208, the drain current (Id10) of the TUT post-stress is measured using the same gate and drain voltages as used in step 204. The change in drain current is determined and normalized (ΔId) in step 210 and, in step 212, the results compared to a drain current change threshold, Ith, to determine if the change in drain current post-stress is so high that further HCI testing is needed (step 214) or the wafer passes HCI screening in step 216 and the wafer undergoes further parametric and functional testing. The threshold current change Ith is, in this example, approximately 4% but can be another amount depending on the desired lifetime of the wafer 100 and the level of stress applied in step 206, as is well known in the art.

The additional HCI testing in step 214 may be similar to that disclosed in the JEDEC documents referred to above. This additional, conventional HCI testing generally comprises repeating the stress and test steps (206-210) for successively longer stress time periods until an accumulated stress time is met or exceeded or the drain current Id10 differs from the initial current flow Id0 by greater than a selected amount, e.g., 10%. Advantageously, the short HCI screening test 200 allows HCI testing of all wafers without the need for the time consuming conventional HCI testing unless the screening test indicates otherwise.

Figure 3:
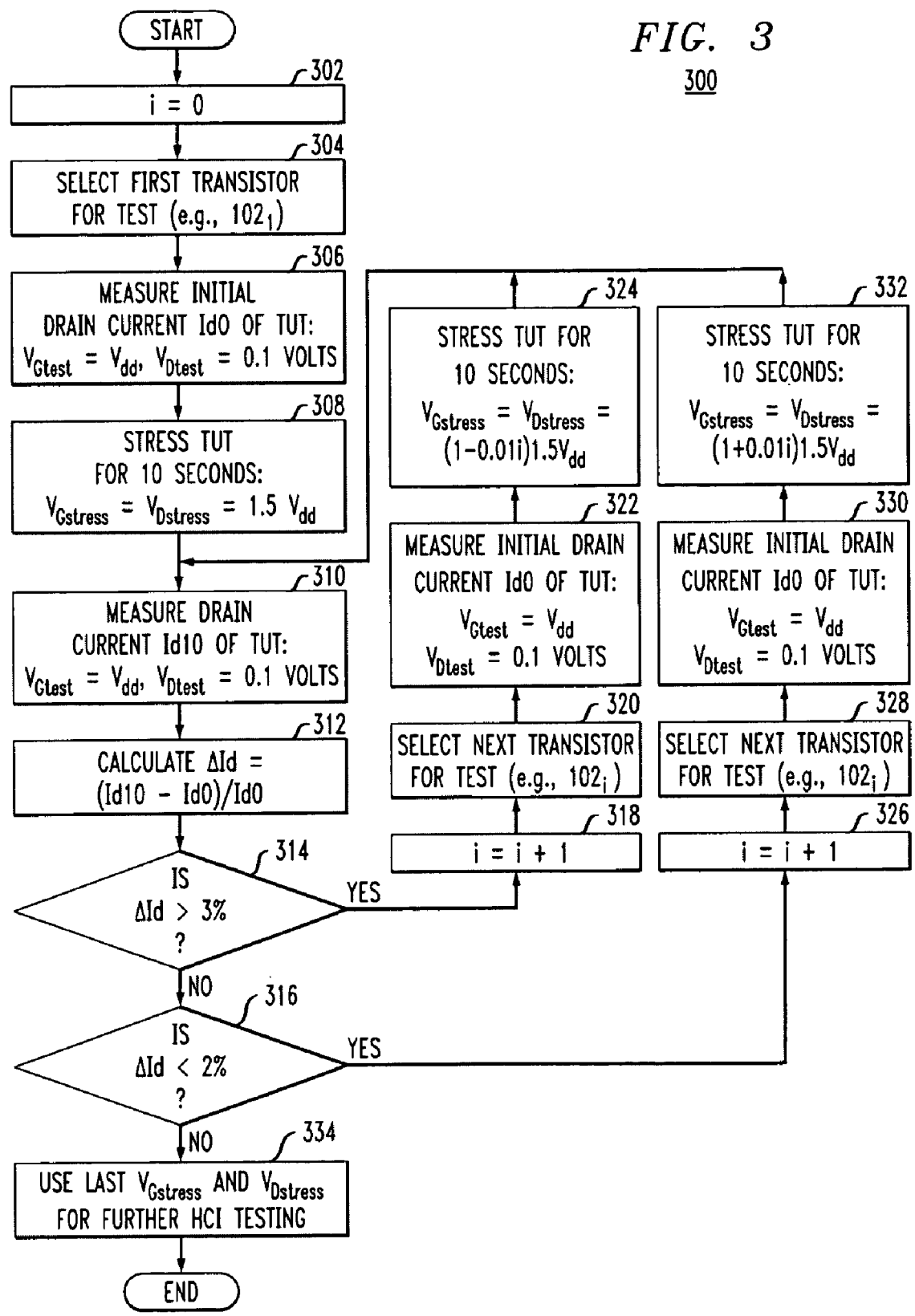
FIG. 3 is a simplified flowchart illustrating an exemplary process to determine stress voltages for an HCI test utilizing the test apparatus of FIG. 1 and as used in the HCI screening test of FIG. 2, according to another embodiment of the invention.

The process steps 300 illustrated in FIG. 3 may be used to determine the desired $V_{Gstress}$ and $V_{Dstress}$ voltages. In this embodiment and because all transistors have some amount of HCI susceptibility, the stress voltages are selected such that the change in drain current (ΔId), resulting from the application of the stress voltages, is within a desired range for a "nominal" transistor (i.e., a transistor without significant HCI susceptibility as determined by, for example, a wafer using conventional HCI test described above), here between 2% and 3%. It is understood that the range of 2% to 3% is only exemplary and other values may be used instead. Generally, the range values are chosen to be large enough that a consistently measurable value of current change occurs but is less than the drain current change threshold, Ith, as discussed above in connection with step 212.

Beginning with step 302, an integer index value i (1≦i≦N), used in later steps, is initialized. In step 304, a first transistor, such as transistor 102₁ in FIG. 1, is chosen as the TUT. It is understood that this TUT has not been previously stressed. Steps 306, 308, 310, and 312 are the same as, and correspond to, the steps 204, 206, 208, and 210, as described above, but, in step 308, the stress voltages $V_{Gstress}$, $V_{Dstress}$ are approximately 1.5 Vdd in this example, but other voltages may be used as well. In steps 314 and 316, the normalized drain current change, ΔId, is checked to see if it is within the desired range, here between 2% and 3%. If ΔId is above or below the desired range as determined in steps 314 and 316, the stress voltages are lowered or increased, respectively, in steps 318-332. In more detail, in step 318, the index i is incremented and a new, unstressed transistor is chosen as the TUT in step 320, and the initial (pre-stress) drain current is measured for the new TUT in step 322. Then the stress voltages are incrementally decreased in step 324 and the stress/test steps 310-314 are repeated but using different transistors (as selected in step 320) as the TUT until the ΔId is less than or equal to 3%. Similarly, in step 326, the index i is incremented and a new, unstressed transistor is chosen as the TUT in step 328, and the initial (pre-stress) drain current is measured for the new TUT in step 330. Then the stress voltages are incrementally increased in step 332 and the stress/test steps 310-316 are repeated but using different transistors (as selected in step 328) as the TUT until the ΔId is more than or equal to 2%. If the ΔId is between 2% and 3% inclusive, then, in step 334, the final (adjusted) stress voltages may then be used in the HCI screening test 200, described above, or for the conventional HCI test described above.

It is understood that while the stress voltages $V_{Gstress}$ and $V_{Dstress}$ are shown as having the same voltage in the embodiments described above, they may have different voltages. For example, the gate stress voltage, $V_{Gstress}$, may be fixed at, for example, Vdd, while $V_{Dstress}$ is adjusted in accordance with the process steps 300. Further, the order of the steps may be changed and other steps added, as desired.

It is understood that while the embodiment shown herein is for testing an integrated circuit, the invention may be used in any application where hot-carrier injection testing is needed or desired, e.g., in power transistors for power amplifiers, etc.

For purposes of this description and unless explicitly stated otherwise, each numerical value and range should be interpreted as being approximate as if the word "about" or "approximately" preceded the value of the value or range. Further, signals and corresponding nodes, ports, inputs, or outputs may be referred to by the same name and are interchangeable. Additionally, reference herein to "one embodiment" or "an embodiment" means that a particular feature, structure, or characteristic described in connection with the embodiment can be included in at least one embodiment of the invention. The appearances of the phrase "in one embodiment" in various places in the specification are not necessarily all referring to the same embodiment, nor are separate or alternative embodiments necessarily mutually exclusive of other embodiments. The same applies to the terms "implementation" and "example."

Also for purposes of this description, the terms "couple," "coupling," "coupled," "connect," "connecting," or "connected," refer to any manner known in the art or later developed in which a signal is allowed to be transferred between two or more elements and the interposition of one or more additional elements is contemplated, although not required. Conversely, the terms "directly coupled," "directly connected," etc., imply the absence of such additional elements.

It is understood that various changes in the details, materials, and arrangements of the parts which have been described and illustrated in order to explain the nature of this invention may be made by those skilled in the art without departing from the scope of the invention as expressed in the following claims.

The use of figure numbers and/or figure reference labels in the claims is intended to identify one or more possible embodiments of the claimed subject matter in order to facilitate the interpretation of the claims. Such use is not to be construed as necessarily limiting the scope of those claims to the embodiments shown in the corresponding figures.

Although the elements in the following method claims, if any, are recited in a particular sequence with corresponding labeling, unless the claim recitations otherwise imply a particular sequence for implementing some or all of those elements, those elements are not necessarily intended to be limited to being implemented in that particular sequence.

The invention claimed is:

1. A method of hot-carrier injection screening a plurality of wafers, the method comprising:
    a) selecting one wafer from the plurality of wafers, each wafer having a plurality of MOSFETs thereon and each of the MOSFETs having at least a gate, a drain, and a threshold voltage;
    b) selecting one of the plurality of MOSFETs on the selected wafer;
    c) applying a gate test voltage to the gate of the selected MOSFET and a drain test voltage to the drain of the selected MOSFET and measuring an initial current flow in the drain of the selected MOSFET;
    d) applying, during a stress time period, a gate stress voltage to the gate of the selected MOSFET and a drain stress voltage to the drain of the selected MOSFET;
    e) applying, at a time subsequent to the stress time period, the gate test voltage to the gate and the drain test voltage to the drain of the selected MOSFET and measuring a test current flow in the drain of the selected MOSFET;
    f) adjusting at least one of the gate and drain stress voltages if the test current flow differs from the initial current flow by an amount that is outside of a desired range;
    g) repeating steps c) through f) with another MOSFET selected from the plurality of MOSFETs until the test current flow differs from the initial current flow by an amount that is within the desired range; and
    h) hot-carrier injection testing at least one of the remaining wafers of the plurality of wafers using the stress voltages determined in steps c) through g);

wherein the drain test voltage is less than the threshold voltage.

2. The method as recited in claim 1, wherein in step f), the gate and drain stress voltages are substantially equal and the stress voltages are adjusted by incrementing the stress voltages in substantially equal steps if the test current flow differs from the initial current flow by an amount that is less than the desired range, or the stress voltages are adjusted by decrementing the voltages in substantially equal steps if the test current flow differs from the initial current flow by an amount that is greater than the desired range.

3. The method as recited in claim 1, wherein step h) further comprises the steps of:
   h1) selecting another wafer from the plurality of wafers, the another wafer having at least one MOSFET thereon, the MOSFET having at least a gate and a drain;
   h2) measuring an initial current flow in the drain while the gate test voltage is applied to the gate and the drain test voltage is applied to the drain of the MOSFET of the another wafer;
   h3) applying, during a stress time period, the gate stress voltage to the gate and the drain stress voltage to the drain of the MOSFET of the another wafer; and
   h4) applying, at a time subsequent to the stress time period, the gate test voltage to the gate and the drain test voltage to the drain of the MOSFET of the another wafer and measuring a test current flow in the drain of the MOSFET of the another wafer;
   wherein if the test current flow differs from the initial current flow by an amount that is less than a threshold amount, then the another wafer passes the hot-carrier screen.

4. The method as recited in claim 3, wherein, if the test current flow in step h4) differs from the initial current flow in step h2) by an amount that is greater than the threshold amount, then the screening method further comprises the steps of:
   i) repeating steps h3) and h4) for successively longer stress time periods until a maximum accumulated stress time is approximately met or the test current flow differs from the initial current flow by an amount that is greater than a selected amount, the selected amount being greater than the threshold amount.

5. The method as recited in claim 4, wherein, the another wafer passes the hot-carrier screen if, in step i), the test current flow differs from the initial current flow by an amount that is less than the selected amount.

6. The method as recited in claim 5, wherein the threshold amount and the selected amount are expressed in a percent change and the first and second selected amounts are approximately 3% and 4%, respectively.

7. The method as recited in claim 4, wherein the selected MOSFET and the MOSFET of the another wafer have substantially equal design voltages and a threshold voltages, the gate test voltage is approximately the design voltage, the drain test voltage is less than the threshold voltage, and the gate and drain stress voltages are substantially the same and greater than the design voltage.

8. The method as recited in claim 1, wherein the gate stress voltage is less than the drain stress voltage.

9. A method of hot-carrier screening a plurality of wafers, the method comprising:
   a) selecting one wafer from the plurality of wafers, each wafer having a plurality of MOSFETs thereon and each of the MOSFETs having at least a gate, a drain, and a threshold voltage;
   b) selecting one of the plurality of MOSFETs on the selected wafer;
   c) applying a gate test voltage to the gate of the selected MOSFET and a drain test voltage to the drain of the selected MOSFET and measuring an initial current flow in the drain of the selected MOSFET;
   d) applying, during a stress time period, a stress voltage to the gate and drain of the selected MOSFET;
   e) applying, at a time subsequent to the stress time period, the gate test voltage to the gate and the drain test voltage to the drain of the selected MOSFET and measuring a test current flow in the drain of the selected MOSFET;
   f) adjusting the stress voltage if the test current flow differs from the initial current flow by an amount that is outside of a desired range;
   g) repeating steps c) through f) with another MOSFET selected from the plurality of MOSFETs until the test current flow differs from the initial current flow by an amount that is within the desired range
   h) selecting another wafer from the plurality of wafers, the another wafer having at least one MOSFET thereon, the MOSFET having at least a gate and a drain;
   i) applying the gate test voltage to the gate and the drain test voltage to the drain of the MOSFET of the another wafer and measuring an initial current flow in the drain;
   j) applying, during a stress time period, the adjusted stress voltage to the gate and the drain of the MOSFET of the another wafer; and
   k) applying, at a time subsequent to the stress time period in step j), the gate test voltage to the gate and the drain test voltage to the drain of the MOSFET of the another wafer and measuring a test current flow in the drain of the MOSFET of the another wafer;
   wherein the drain test voltage being less than the threshold voltage,
   wherein, in step f), the adjusted stress voltages are adjusted by incrementing the voltages in substantially equal steps if the test current flow differs from the initial current flow by an amount that is less than the desired range, or the stress voltages are adjusted by decrementing the voltages in substantially equal steps if the test current flow differs from the initial current flow by an amount that is greater than the desired range, and
   wherein if the test current flow measured in step k) differs from the initial current flow measured in step i) by less than a threshold amount, then the another wafer passes the hot-carrier screen.

10. The method as recited in claim 9, wherein the selected MOSFET and the MOSFET of the another wafer have substantially equal design voltages and a threshold voltages, the gate test voltage is approximately the design voltage, the drain test voltage is less than the threshold voltage, and the adjusted stress voltage is greater than the design voltage.

11. A method of hot-carrier injection screening, the method comprising:
   a) selecting one wafer from a plurality of wafers, each wafer having a plurality of MOSFETs thereon and each of the MOSFETs having at least a gate, a drain, and a threshold voltage;
   b) selecting one of the plurality of MOSFETs on the selected wafer;
   c) applying a gate test voltage to the gate of the selected MOSFET and a drain test voltage to the drain of the selected MOSFET and measuring an initial current flow in the drain of the selected MOSFET;

d) applying, during a stress time period, a gate stress voltage to the gate of the selected MOSFET and a drain stress voltage to the drain of the selected MOSFET;

e) applying, at a time subsequent to the stress time period, the gate test voltage to the gate and the drain test voltage to the drain of the selected MOSFET and measuring a test current flow in the drain of the selected MOSFET;

f) adjusting at least one of the gate and drain stress voltages if the test current flow differs from the initial current flow by an amount that is not within a desired range; and g) repeating steps c) through f) with another MOSFET selected from the plurality of MOSFETs until the test current flow differs from the initial current flow by an amount that is within the desired range.

12. The method as recited in claim 11, wherein in step f), the gate and drain stress voltages are substantially equal and the stress voltages are adjusted by incrementing the stress voltages in substantially equal steps if the test current flow differs from the initial current flow by an amount that is less than the desired range, or the stress voltages are adjusted by decrementing the voltages in substantially equal steps if the test current flow differs from the initial current flow by an amount that is greater than the desired range.

13. The method as recited in claim 11, further comprising the steps of:

h1) selecting another wafer from the plurality of wafers, the another wafer having at least one MOSFET thereon, the MOSFET having at least a gate and a drain;

h2) measuring an initial current flow in the drain while the gate test voltage is applied to the gate and the drain test voltage is applied to the drain of the MOSFET of the another wafer;

h3) applying, during a stress time period, the gate stress voltage to the gate and the drain stress voltage to the drain of the MOSFET of the another wafer; and h4) applying, at a time subsequent to the stress time period, the gate test voltage to the gate and the drain test voltage to the drain of the MOSFET of the another wafer and measuring a test current flow in the drain of the MOSFET of the another wafer;

wherein if the test current flow differs from the initial current flow by an amount that is less than a threshold amount, then the another wafer passes the hot-carrier screen.

14. The method as recited in claim 13, wherein, if the test current flow in step h4) differs from the initial current flow in step h2) by an amount that is greater than the threshold amount, then the screening method further comprises the steps of:

i) repeating steps h3) and h4) for successively longer stress time periods until a maximum accumulated stress time is approximately met or the test current flow differs from the initial current flow by an amount that is greater than a selected amount, the selected amount being greater than the threshold amount.

15. The method as recited in claim 14, wherein, the another wafer passes the hot-carrier screen if, in step i), the test current flow differs from the initial current flow by an amount that is less than the selected amount.

16. The method as recited in claim 14, wherein the threshold amount and the selected amount are expressed in a percent change and the first and second selected amounts are approximately 3% and 4%, respectively.

17. The method as recited in claim 14, wherein the selected MOSFET and the MOSFET of the another wafer have substantially equal design voltages and a threshold voltages, the gate test voltage is approximately the design voltage, the drain test voltage is less than the threshold voltage, and the gate and drain stress voltages are substantially the same and greater than the design voltage.

18. The method as recited in claim 11, wherein the gate stress voltage is less than the drain stress voltage.

19. The method as recited in claim 11, wherein the drain test voltage is less than the threshold voltage of the selected MOSFET.

* * * * *